United States Patent [19]
Scott

[11] Patent Number: 4,928,072
[45] Date of Patent: May 22, 1990

[54] AMPLIFIER HAVING SUPPRESSED SPURIOUS FREQUENCY COMPONENTS

[75] Inventor: John C. Scott, Jamaica Plain, Mass.

[73] Assignee: Raytheon Company, Lexington, Mass.

[21] Appl. No.: 376,475

[22] Filed: Jul. 5, 1989

[51] Int. Cl.$^5$ ............................................. H03F 1/26
[52] U.S. Cl. .................... 330/149; 330/295; 330/296
[58] Field of Search ............... 330/124 R, 130, 136, 330/137, 149, 295, 296; 332/107, 116; 342/202, 203, 204; 455/114, 127

[56] References Cited

U.S. PATENT DOCUMENTS

| | | | |
|---|---|---|---|
| 3,667,049 | 5/1972 | Ostroff et al. | 375/60 X |
| 4,320,399 | 3/1982 | Buck et al. | 342/204 |
| 4,379,996 | 4/1983 | Weber | 330/296 |

Primary Examiner—James B. Mullins
Attorney, Agent, or Firm—Christopher L. Maginniss; Richard M. Sharkansky

[57] ABSTRACT

A circuit for the suppression of spurious frequency components for use in cascaded class C common base transistor amplifiers. The circuit uses a capacitor and shunt diode connected in series between emitter and ground of each stage to slow the pulse falltime and thereby eliminate spurious frequencies resulting from parasitic-caused ringing. The cathode-to-capacitor junction is pulsed through an RF choke at the pulse repetition frequency by a pulse generator. This effectively replaces the fast trailing edge of the RF pulse with the slower turn-on time of the PIN diode circuit. The resulting slower falltime eliminates spurious frequency production that normally occurs at each stage of cascaded amplifiers.

28 Claims, 4 Drawing Sheets

AMPLIFIER HAVING SUPPRESSED SPURIOUS FREQUENCY COMPONENTS

BACKGROUND OF THE INVENTION

This invention relates generally to transistor amplifiers and, more particularly, to a class C common base transistor amplifier having a control circuit coupled to the input thereof for suppressing the production of spurious frequency components in the vicinity of the carrier frequency.

The class C common base amplifier is the most widely used configuration for power stages of radio frequency (RF) signals, particularly from UHF to S band. It is more efficient than other modes of operation (Class A, Class AB, etc.) and provides higher gain and better stability than its common emitter counterpart. An illustrative class C common base transistor amplifier comprises an NPN transistor having its emitter electrode as an input terminal, its collector electrode as an output terminal, and its base electrode coupled to a reference voltage, typically ground. In this configuration, the collector electrode is biased positively with respect to the emitter electrode.

The operation of this amplifier may be described as follows: during the negative half cycle of the input signal, the base-emitter junction is forward biased. After the negative voltage surpasses the base-emitter voltage drop, the transistor turns on and draws collector current. This current forms the negative half cycle of the output signal. During the positive half cycle of the input signal, the base-emitter junction is reverse biased, and the transistor is turned off. During this time, energy stored in the transistor collector circuit is dissipated in the load to form the positive half cycle of the output signal. Because the transistor is conducting for less than 180 degrees of the RF cycle, this is a very efficient mode of operation. Unfortunately, it is also the mode that produces the worst output spectrum.

During normal operation of a class C common base amplifier, the current flowing out of the emitter will have a small dc component due to the self bias of the base-emitter junction. This dc component flows through the emitter bias return to ground, whenever the RF signal is present at the transistor input. Because the emitter bias return has a certain amount of inherent inductance, energy will be stored during the RF pulse. At the end of the RF pulse, this energy discharges through the transistor input terminals. This inductive discharge injects holes into the transistor base region, and thereby keeps the transistor on for a period determined by the time constant of the inductance and the input parasitics of the transistor.

Because the transistor is biased on during this transient period, any positive feedback path that exists is allowed to produce spurious oscillations or ringing. These oscillations appear in the output spectrum as spurious frequency components. These frequency components appear as relatively wide peaks in the skirt of the output spectrum profile, as may be seen in FIG. 1. As shown, the amplitudes of many of these components may exceed acceptable levels as typically specified for use in high power radar transmitters. As an example, most high power radar systems in use today require all spurious components to be from 70 to 90 decibels below the carrier frequency amplitude (dBc) in a one kilohertz bandwidth.

SUMMARY OF THE INVENTION

With this background of the invention in mind, it is an object of the present invention to provide an improved class C transistor amplifier.

It is additionally an object of the present invention to provide an improved class C common base transistor amplifier having a control circuit coupled to the input thereof for suppressing the production of spurious frequency components in the vicinity of the carrier frequency.

These and other objects are met by a combination including an amplifier having input and output terminals, means coupled to the amplifier input terminal for generating pulses of RF energy, and means for increasingly reflecting the RF energy from the amplifier input terminal during each of the pulses.

According to the preferred embodiment of the present invention, an amplifier comprises a transistor having input and output terminals and means coupled to the transistor input terminal for generating pulses of RF energy. Means are provided for generating a signal pulse having a signal level transition time substantially greater than the falltime of the RF pulse. Means are further provided for coupling the signal pulse generating means to the transistor input terminal, such that the signal pulse increasingly reflects the RF energy away from the transistor input terminal during the transition of the signal pulse.

Further according to the present invention, there is disclosed a multi-stage amplifier system including a plurality of amplifiers disposed in a cascade configuration, wherein each amplifier in the final stage includes input and output terminals, each of the final stage amplifiers being coupled to an amplifier in the previous stage and receiving pulses of RF energy therefrom at their input terminals. Means are provided for generating a time-varying bias voltage at each of the final stage amplifier input terminals during each of the RF pulses, the time-varying bias voltage increasingly reflecting the RF energy from each of the final stage amplifier input terminals as the bias voltage increases.

With the structure disclosed herein, a common emitter transistor amplifier, biased so as to operate in the class C mode, includes a control circuit for increasing the falltime of an RF pulse applied to an input terminal of the transistor, to thereby suppress the production of spurious frequency components in the vicinity of the RF carrier frequency.

BRIEF DESCRIPTION OF THE DRAWINGS

The foregoing features of the present invention and the advantages thereof may be fully understood from the following detailed description read in conjunction with the accompanying drawings in which.

DESCRIPTION OF THE PREFERRED EMBODIMENT

Figure 2:
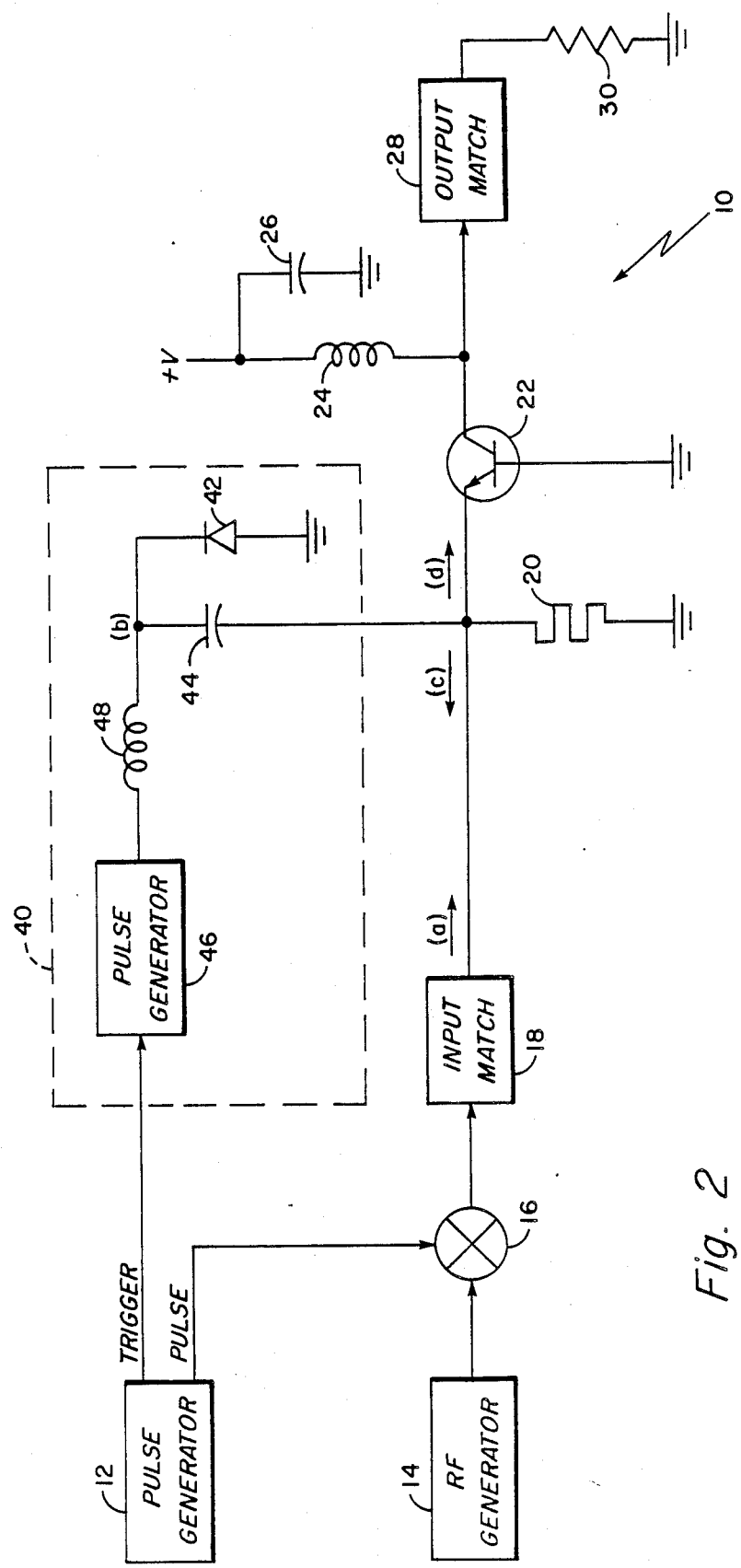
FIG. 2 is a schematic of a class C common base transistor amplifier including the spectrum control circuit of the present invention.

Referring to FIG. 2, there is shown a class C common base transistor amplifier 10. Amplifier 10 comprises an NPN transistor 22, an input impedance matching network 18, and an output impedance matching network 28 for matching the output impedance of transistor 22 to the output load 30. Amplifier 10 further includes RF choke 24, capacitor 26 and quarter wave short circuit stub 20, the combination of which keep transistor 22 biased on by maintaining a forward bias at the collector. Mixer 16 combines pulse signals from pulse generator 12 and RF signals from RF generator 14 to produce RF pulses which are coupled through input matching network 18 to the emitter electrode of transistor 22.

In an illustrative configuration, amplifier 10 operates within the frequency range of 420-450 MHz, preferably at 435 MHz, and is implemented on a microstrip structure. As such, the impedance matching networks 18 and 28 and the short circuit stub 20 comprise trace lines of the microstrip circuit. In the present example, input impedance matching network 18 transforms the impedance between approximately 50 ohms and a nominal value of 5 ohms. Similarly, output impedance matching network 28 transforms the impedance between a nominal value of 5 ohms and approximately 50 ohms. Nominal values are described for the impedances adjacent transistor 22 as these values vary over the frequency range. Short circuit stub 20 has an effective electrical length of one-quarter wavelength at the operating frequency of interest.

In the present example, transistor 22 is an NPN silicon high frequency power bipolar junction transistor which may be similar to Part No. PH 8296, sold by M/A-COM PHI, Inc., of Torrance, Calif. In this example, the biasing network comprises RF choke 24, coupled between a source of positive dc potential (not shown) and the collector electrode of transistor 22, bias stabilization capacitor 26, coupled between the positive dc potential and ground, and quarter wave short circuit stub 20, coupled between the emitter electrode of transistor 22 and ground. RF choke 24 and short circuit stub 20 appear as open circuits to the RF energy and short circuits to the dc energy, thereby isolating the RF energy from the dc bias paths. Capacitor 26 has an illustrative capacitance value of 18 $\mu f$.

Pulse generator 12, which may illustratively be of a type similar to Model No. HP 8005B, sold by Hewlett-Packard Co., of Palo Alto, Calif., provides a sequence of pulses to a first input of mixer 16. In the present example, the pulses from pulse generator 12 each have a duration of 10 msec at a duty cycle of 20 percent. It is therefore seen that the pulse repetition frequency of amplifier 10 is 20 Hz. RF generator 14 provides an RF signal, at a frequency of 435 MHz in the present example, to a second input of mixer 16. The resulting output signal from mixer 16 comprises a series of RF bursts of 10 msec, spaced from each other by 40 msec. Additionally, it will be noted that the RF pulses typically have a fall time of approximately 40 nsec.

Figure 1:
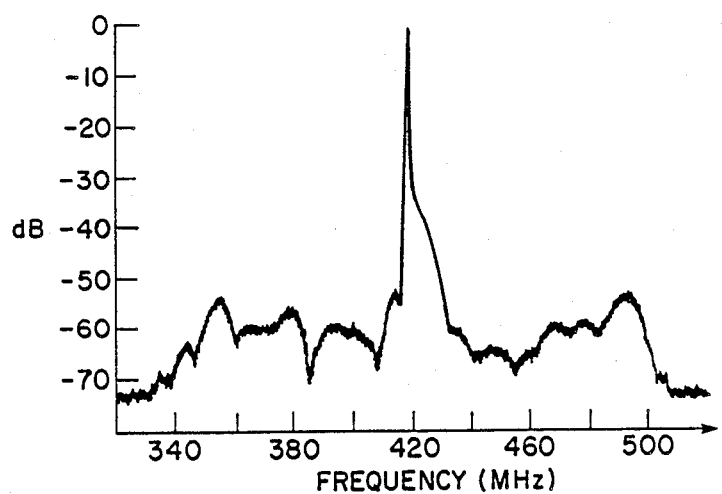
FIG. 1 illustrates the frequency spectrum of a class C common base transistor amplifier according to the prior art.

During the operation of amplifier 10 as hereinbefore described, the current flowing from the emitter electrode of transistor 22 will have a small dc component due to the self bias of the base-emitter junction. This dc component flows through quarter wave short circuit stub 20 to ground whenever an RF pulse from mixer 16 is present at the emitter. Because short circuit stub 20 has a certain amount of inherent inductance, energy is stored therein during the RF pulse. At the end of the pulse, this stored energy discharges through the input terminals of transistor 22, forming a current in the path comprising short circuit stub 20 and the base and emitter electrodes of transistor 22. This inductive discharge injects holes into the base region of transistor 22, thereby maintaining transistor 22 in an on state for a period determined by the time constant of the inductance of stub 20 and the input parasitics of transistor 22. As transistor 22 is biased on during this period of discharge, any positive feedback path that exists is enabled to produce spurious oscillations. These oscillations appear in the output spectrum of FIG. 1 as spurious frequency components. It will be noted that a first spurious component at approximately 356 MHz has a peak of 54 dB below the level of the carrier frequency amplitude (420 MHz in the example of FIG. 1), and a second spurious component at approximately 492 MHz also has its peak of 54 dBc below the carrier frequency level. Clearly, the amplitudes of these components, as well as many others shown in FIG. 1, are far greater than acceptable maximums as defined earlier.

The applicant has determined that the use of an RF pulse having a slow fall time ensures the presence of at least some RF energy at the input of transistor 22 throughout the transient period, thereby locking the frequency of operation of transistor 22 to the carrier frequency during this period. This practice suppresses the spurious frequency components and results in a clear output spectrum.

The recognition of the cause of the spurious frequency components might suggest that a solution to the problem would be the use of a slow falltime input pulse to the radar transmitter. Unfortunately, this solution is generally ineffective as most high power, solid-state transmitters use nine or more class C amplifier stages to achieve the required system power. Each of these stages speeds up the falltime of the RF pulse, and when the final stage is reached, the pulse has developed a very fast falltime and hence generates the spurious components.

In accordance with the present invention, amplifier 10 further includes a control circuit 40 for slowing the fall time of the RF pulses appearing at the emitter electrode of transistor 22. Control circuit 40 comprises PIN diode 42 and capacitor 44, coupled in series between the emitter electrode of transistor 22 and ground. More specifically, capacitor 44 is coupled between the emitter electrode and the cathode of diode 42, while the anode of diode 42 is coupled to ground. Pulse generator 46, responsive at a trigger input terminal to a trigger input signal from pulse generator 12 at the pulse repetition frequency, provides a pulse output signal through RF choke 48 to the junction of diode 42 and capacitor 44. The trigger input signals from pulse generator 12 are typically coincident with the leading edges of the pulses from generator 12; accordingly, pulse generator 46 includes delay circuitry such that its pulse output signals occur slightly before the end of each RF pulse through transistor 22. The result is that PIN diode 42 is forward biased at a time just before the RF pulse ends. This effectively replaces the fast trailing edge of the RF pulse with the slower turn on time of PIN diode 42 by reflection.

PIN diode 42 may illustratively be of the type sold as Part No. MA47283 by M/A-COM, Inc., of Burlington, Mass. Capacitor 44 is preferably a 100 pf ceramic capacitor; in the disclosed embodiment, including a microstrip structure, capacitor 44 comprises a ceramic chip. Pulse generator 46 may illustratively be of the same type as pulse generator 12. This particular pulse generator includes front panel controls for selecting the desired delay period between receipt of the input trigger signal and the onset of the output pulse, and for selecting the width of the output pulse. The need for these controls will be recognized from the following operational description of the present invention.

Referring to FIGS. 3a through 3d, there is shown a series of waveform plots which are useful in understanding the operation of the present invention. The waveforms of FIGS. 3a-3d are related by a common time axis. Waveforms 3(a), 3(c) and 3(d) represent the envelopes of RF pulses; waveform 3(b) is a plot of voltage verses time.

Figure 3:
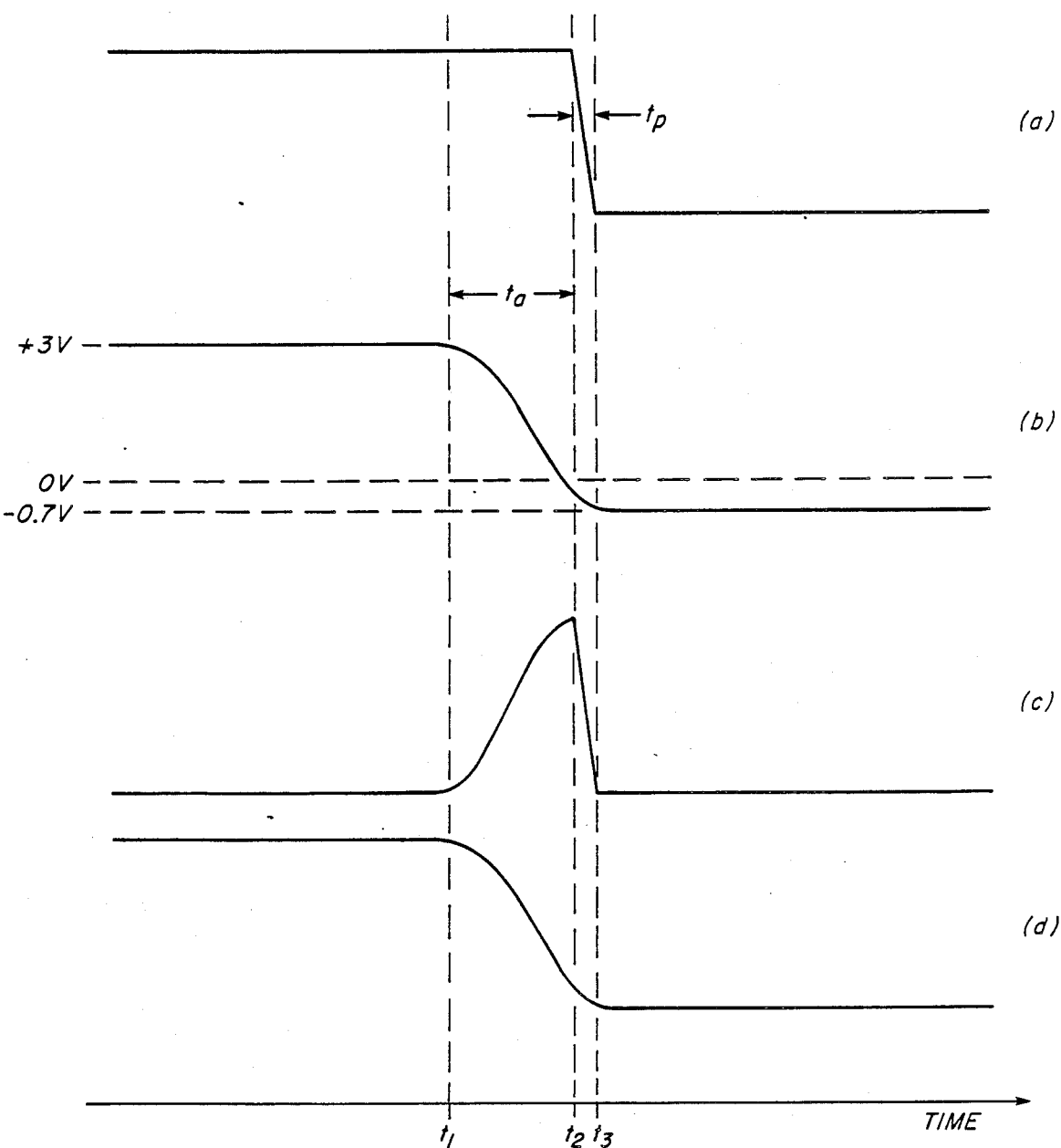
FIG. 3a through 3d are waveform plots useful in understanding the present invention.

FIG. 3(a) illustrates the envelope of the final portion of an RF pulse which is generated from mixer 16 toward the emitter electrode of transistor 22. (See arrow (a) in FIG. 2). As shown, the RF pulse has a very steep falling slope, indicative of a fast fall time $t_p$ which occurs between $t_2$ and $t_3$. In the present example, $t_p$ is illustratively 40 nsec.

FIG. 3(b) represents the waveform of the voltage at the cathode of diode 42 (node (b) in FIG. 2). Waveform (b) is the response of diode 42 to a pulse from pulse generator 46 whose falling edge occurs at $t_1$, which, in the present example, may be approximately 300 nsec before $t_2$. The initial voltage at (b), +3 volts in the present example, maintains a reverse bias across diode 42. At time $t_1$, pulse generator 46 generates a negative-going pulse, which results in a falling voltage across across diode 42 until it begins to conduct, at approximately −0.7 volts with respect to ground. Because of the nature of PIN diode 42, i.e., its slow switching characteristics, a gradually falling voltage appears at (b) in response to the negative pulse initiated from pulse generator 46 at time $t_1$.

FIG. 3(c) illustrates an envelope of the portion of the RF pulse from mixer 16 which is reflected away from transistor 22 as a result of the slowly falling voltage at (b). Waveform 3(c) is reflected back toward mixer 16 and has the effect of subtraction from the pulse whose envelope is represented in waveform 3(a).

FIG. 3(d) illustrates the envelope of the RF pulse which reaches the emitter electrode of transistor 22. Waveform 3(d) is the difference between waveforms 3(a) and 3(c), i.e., the transmitted and reflected portions of the RF pulse. It is clearly seen that waveform 3(d) has a slow falltime, between $t_1$ and $t_3$ which, in the present example, spans approximately 340 nsec. It is this slow falltime that affords the amplifier of the present invention an output spectrum which is relatively free of spurious frequency components.

Figure 4:
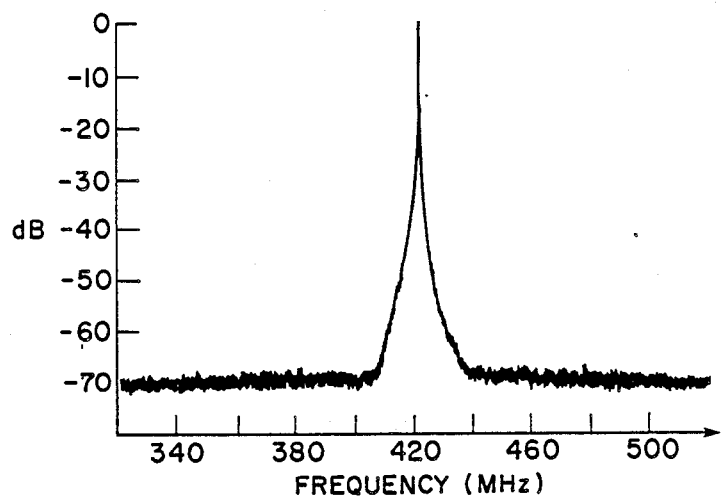
FIG. 4 illustrates the frequency spectrum of a class C common base transistor amplifier including the present invention.

Referring to FIG. 4, and comparing the spectrum profile thereon with the spectrum profile of FIG. 1, there is seen the degree of improvement provided by the present invention. Whereas FIG. 1 shows two spurious frequency components at 54 dB below the level of the carrier frequency amplitude as well as many other spurious components, FIG. 4, depicting the spectrum profile of the amplifier embodied in FIG. 2, illustrates a spectrum in which all offcarrier frequency components are at least 70 dB below the level of the carrier.

Figure 5:
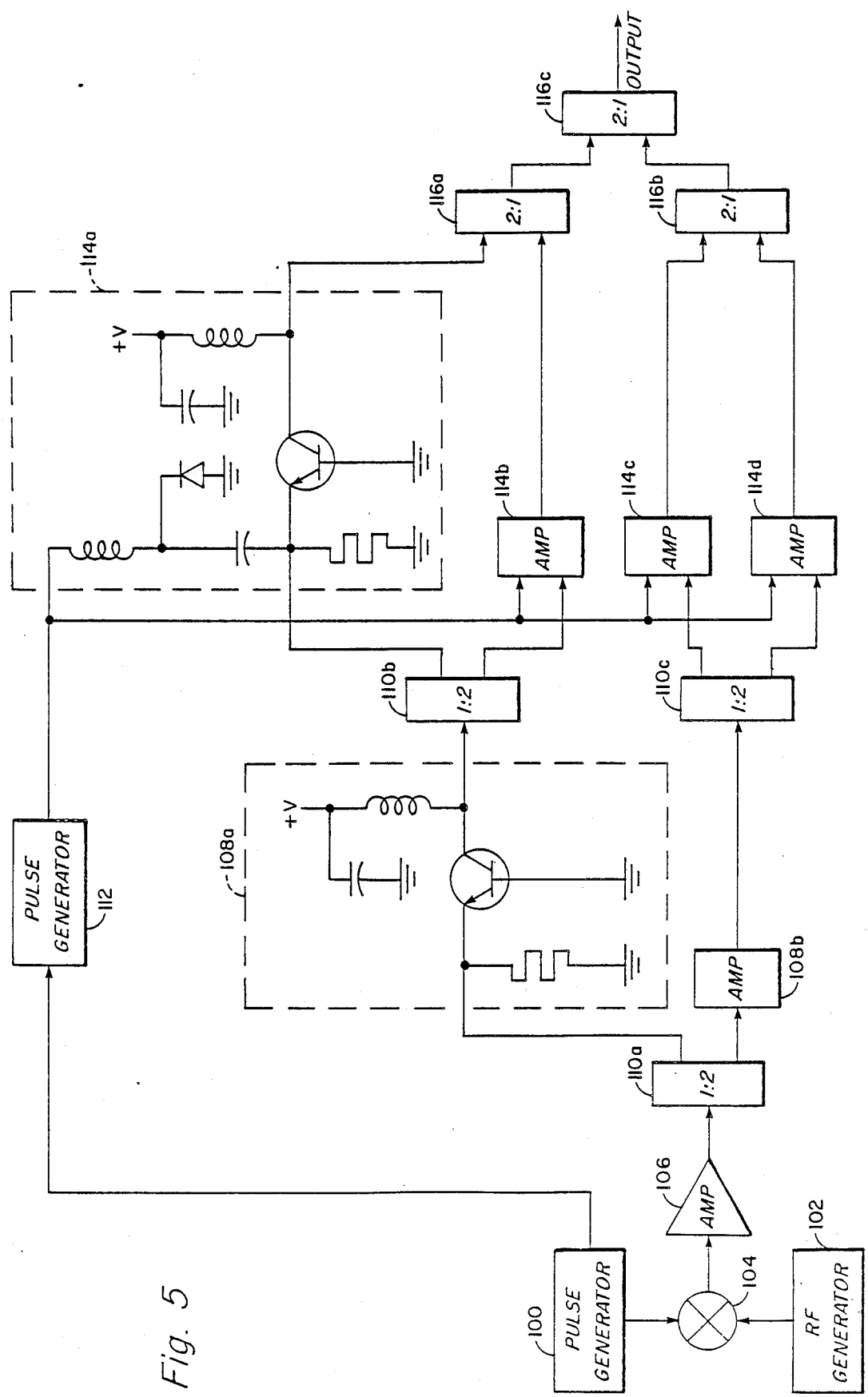
FIG. 5 is a combination schematic/block diagram of a cascade of amplifiers including the amplifier of FIG. 2.

Referring to FIG. 5, there is shown a three stage amplifier suitable for use in generating the radiated signal in a large phased array radar system which operates in the UHF band (420–450 MHz). The amplifier of FIG. 5 comprises three cascaded amplifier modules in the one-driving-two-driving-four configuration. The amplifier 106 of the predriver stage comprises a class C common emitter bipolar junction transistor (BJT) amplifier, and the driver stages 108a, 108b and final stages 114a, 114b, 114c, 114d comprise class C common base BJT amplifiers.

Considering the three stage amplifier of FIG. 5 in greater detail, pulse generator 100, RF generator 102 and mixer 104 are substantially indentical to, and perform identical functions as, their counterparts in the FIG. 2 embodiment. Amplifier 106, a class C common emitter bipolar junction transistor amplifier, amplifies the RF bursts from mixer 104, and applies the amplified output signal to a splitting network 110a. Hybrid splitting network 110a splits the signal from amplifier 106 into two substantially equal components. These two components are individually amplified by amplifiers 108a and 108b, which are identical.

Amplifier 108a (and amplifier 108b) is a class C common base bipolar junction transistor amplifier which is substantially identical to the amplifier comprising transistor 22, RF choke 24, capacitor 26, and short circuit stub 20 of the FIG. 2 embodiment. The output signals from amplifiers 108a and 108b are coupled, respectively, to hybrid splitting networks 110b and 110c, each of which splits its respective input signal into two substantially equal components. The resulting four signal components are individually amplified by amplifiers 114a, 114b, 114c and 114d, which are identical.

Amplifier 114a (and amplifiers 114b–114d) is a class C common base bipolar junction transistor amplifier which is substantially identical to the amplifier comprising transistor 22, RF choke 24, capacitor 26, short circuit stub 20, PIN diode 42, capacitor 44 and RF choke 48 of the FIG. 2 embodiment. Each amplifier 114a–114d is fed by a pulse signal from pulse generator 112, which is substantially identical to, and performs an identical function as, pulse generator 46 of the FIG. 2 embodiment. Thus, it is seen that the final amplifying stages of the three stage amplifier of the FIG. 5 embodiment include control circuits for suppressing spurious frequency components according to the principles of the present invention.

The output signals from amplifiers 114a and 114b are coupled to the input terminals of hybrid combiner 116a; similarly, the output signals from amplifiers 114c and 114d are coupled to the input terminals of hybrid combiner 116b. The output signals from hybrid combiners 116a and 116b are coupled to the input terminals of hybrid combiner 116c, whose output signal represents the total amplifier output.

Although not explicitly shown in the FIG. 5 representation, each amplifier 106, 108a, 108b, 114a–114d may include an input matching network and an output matching network, which may be similar to the types shown and described as networks 18 and 28, respectively, in FIG. 2 and the descriptive text thereto.

It will be recognized by those knowledgable in the art that hybrid splitters 110a–110c are identical devices to hybrid combiners 116a–116c. In the present example, these devices may be of a type similar to Part No. 1W0263, sold by the Anaren Company of Syracuse, N.Y.

The three stage amplifier illustrated in FIG. 5 may be used for generating the radiated signal in a large phased array radar operating in the UHF band. In typical operation, it is responsive to bursts of RF energy at power levels of 2 watts at the input terminal of amplifier 106 for generating bursts at power levels of 336 watts at the amplifier output. In addition, the three stage amplifier includes control circuits in the final amplifying stages for suppressing spurious frequency components in the amplifier output signal.

While the principles of the present invention have been demonstrated with particular regard to the structure heretofore disclosed, it will be recognized that various departures from the disclosed structure may be undertaken in the practice of the invention. The scope of this invention is therefore not intended to be limited to the particular structure disclosed herein, but should instead be gauged by the breadth of the claims which follow.

What is claimed is:

1. In combination:
   an amplifier having input and output terminals;
   means coupled to said amplifier input terminal for generating pulses of RF energy; and
   means for increasingly reflecting said RF energy from said amplifier input terminal during each of said pulses.

2. The combination according to claim 1 wherein said amplifier comprises a transistor, and wherein said input and output terminals comprise, respectively, the emitter and collector electrodes of said transistor.

3. The combination according to claim 2 further including biasing means for providing a bias current through said transistor, said bias current enabling operation of said amplifier in the class C mode.

4. The combination according to claim 3 wherein said biasing means includes a bias current path for conducting said bias current between first and second potentials.

5. The combination according to claim 4 wherein said bias current path includes means for isolating said RF energy from said first and second potentials.

6. The combination according to claim 5 wherein said isolating means includes a stub having an effective electrical length of one quarter of the wavelength of said RF energy.

7. The combination according to claim 1 wherein said means for generating pulses of RF energy comprises:
   source means for providing a continuous RF signal;
   first pulse signal generating means; and
   means for mixing an RF signal from said source means and a pulse signal from said first pulse signal generating means.

8. The combination according to claim 7 wherein said reflecting means includes second pulse signal generating means responsive to pulses from said first pulse signal generating means, wherein pulses from said second pulse signal generating means are delayed by a predetermined time duration from the occurrences of pulses from said first pulse signal generating means.

9. The combination according to claim 8 wherein said reflecting means further includes a diode coupled to said second pulse signal generating means and to said amplifier input terminal, said diode responsive to pulses from said second pulse signal generating means for being driven from a reverse biased state to a conductive state.

10. The combination according to claim 9 wherein said diode switches from said reverse biased state to said conductive state during a time period substantially longer than the falltime of said RF energy pulses.

11. In combination:
    an amplifier having input and output terminals;
    means coupled to said amplifier input terminal for generating pulses of RF energy; and
    means for providing time-varying bias voltage at said amplifier input terminal during each of said RF pulses, said bias voltage providing means including means for increasingly reflecting said RF energy from said input terminal as said bias voltage decreases.

12. The combination according to claim 11 wherein said amplifier comprises a transistor, and wherein said input and output terminals comprise, respectively, the emitter and collector electrodes of said transistor.

13. The combination according to claim 12 further including biasing means for providing a bias current through said transistor, said bias current enabling operation of said amplifier in the class C mode.

14. The combination according to claim 13 wherein said biasing means includes a bias current path for conducting said bias current between first and second potentials.

15. The combination according to claim 14 wherein said bias current path includes means for isolating said RF energy from said first and second potentials.

16. The combination according to claim 15 wherein said isolating means includes a stub having an effective electrical length of one quarter of the wavelength of said RF energy.

17. The combination according to claim 11 wherein said means for generating pulses of RF energy comprises:
    source means for providing a continuous RF signal;
    first pulse signal generating means; and
    means for mixing an RF signal from said source means and a pulse signal from said first pulse signal generating means.

18. The combination according to claim 17 wherein said means for providing time-varying bias voltage includes second pulse signal generating means responsive to pulses from said first pulse signal generating means, wherein pulses from said second pulse signal generating means are delayed by a predetermined time duration from the occurrences of pulses from said first pulse signal generating means.

19. The combination according to claim 18 wherein said means for providing time-varying bias voltage further includes a diode coupled to said second pulse signal generating means and to said amplifier input terminal, said diode responsive to pulses from said second pulse signal generating means for being driven from a reverse biased state to a conductive state.

20. The combination according to claim 19 wherein said diode switches from said reverse biased state to said conductive state during a time period substantially longer than the falltime of said RF energy pulses.

21. An amplifier comprising:
    a transistor having input and output terminals;
    means coupled to said transistor input terminal for generating pulses of RF energy;
    means for generating a signal pulse during each of said RF pulses, said signal pulse having a signal level transition time substantially greater than the falltime of said RF pulse; and
    means for coupling said signal pulse generating means to said transistor input terminal and for increasingly reflecting said RF energy from said transistor input terminal during said transition of said signal pulse.

22. The amplifier according to claim 21 wherein said input and output terminals comprise, respectively, the emitter and collector electrodes of said transistor.

23. The amplifier according to claim 22 further including biasing means for providing a bias current through said transistor, said bias current enabling operation of said amplifier in the class C mode.

24. The amplifier according to claim 21 wherein said means for generating pulses of RF energy comprises:
source means for providing a continuous RF signal;
second signal pulse generating means; and
means for mixing an RF signal from said source means and a signal pulse from said second signal pulse generating means.

25. The amplifier according to claim 24 wherein said first-mentioned signal pulse generating means is responsive to pulse signals from said second signal pulse generating means, wherein pulses from said first-mentioned signal pulse generating means are delayed by a predetermined time duration from the occurrences of pulses from said second signal pulse generating means.

26. The amplifier according to claim 25 further including a diode coupled to said first-amplifier signal pulse generating means and to said amplifier input terminal, said diode responsive to pulses from said first-mentioned signal pulse generating means for being driven from a reverse biased state to a conductive state.

27. The amplifier according to claim 26 wherein said diode switches from said reverse biased state to said conductive state during a time period substantially longer than the falltime of said RF energy pulses.

28. A multi-stage amplifier system comprising:
a plurality of amplifiers disposed in a cascade configuration, wherein each amplifier in the final stage includes input and output terminals, each of said final stage amplifiers being coupled to an amplifier in the previous stage and receiving pulses of RF energy therefrom at their input terminals; and
means for generating a time-varying bias voltage at each of said final stage amplifier input terminals during each of said RF pulses, said bias voltage generating means including means for increasingly reflecting said RF energy from each of said final stage amplifier input terminals of said bias voltage decreases.

* * * * *